(12) United States Patent
Liu et al.

(10) Patent No.: US 10,886,294 B2
(45) Date of Patent: Jan. 5, 2021

(54) THREE-DIMENSIONAL MEMORY DEVICES AND FABRICATION METHODS THEREOF

(71) Applicant: YANGTZE MEMORY TECHNOLOGIES CO., LTD., Wuhan (CN)

(72) Inventors: Jun Liu, Wuhan (CN); Li Hong Xiao, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 63 days.

(21) Appl. No.: 16/238,452

(22) Filed: Jan. 2, 2019

(65) Prior Publication Data

US 2020/0168626 A1 May 28, 2020

Related U.S. Application Data

(63) Continuation of application No. PCT/CN2018/116980, filed on Nov. 22, 2018.

(51) Int. Cl.
*H01L 27/11* (2006.01)
*H01L 27/11582* (2017.01)
*H01L 21/28* (2006.01)
*H01L 27/1157* (2017.01)
*H01L 27/11568* (2017.01)

(52) U.S. Cl.
CPC .... *H01L 27/11582* (2013.01); *H01L 27/1157* (2013.01); *H01L 27/11568* (2013.01); *H01L 29/40117* (2019.08)

(58) Field of Classification Search
CPC ......... H01L 27/11582; H01L 29/40117; H01L 27/1157; H01L 27/11556; H01L 27/11578
See application file for complete search history.

(56) References Cited

U.S. PATENT DOCUMENTS

2012/0001249 A1\* 1/2012 Alsmeier ............ H01L 27/1157
257/319
2014/0063938 A1\* 3/2014 Oh ...................... G11C 16/0483
365/185.02

(Continued)

FOREIGN PATENT DOCUMENTS

CN 105679761 A 6/2016
CN 106816442 A 6/2017
(Continued)

OTHER PUBLICATIONS

International Search Report issued in corresponding International Application No. PCT/CN2018/116980, dated Aug. 21, 2019, 5 pages.

(Continued)

*Primary Examiner* — Charles D Garber
*Assistant Examiner* — S M Sohel Imtiaz
(74) *Attorney, Agent, or Firm* — Bayes PLLC

(57) ABSTRACT

Embodiments of three-dimensional (3D) memory devices having a memory layer that confines electron transportation and methods for forming the same are disclosed. A method for forming a 3D memory device includes the following operations. An initial channel hole in a structure is formed. The structure includes a plurality first layers and a plurality of second layers alternatingly arranged over a substrate. An offset between a side surface of each one of the plurality of first layers and a side surface of each one of the plurality of second layers can be formed on a sidewall of the initial channel hole to form a channel hole. The channel hole with a channel-forming structure can be formed to form a semiconductor channel. The channel-forming structure can include a memory layer extending along a vertical direction. The plurality of second layers can then be replaced with a plurality of gate electrodes.

20 Claims, 7 Drawing Sheets

(56) References Cited

U.S. PATENT DOCUMENTS

| | | | | |
|---|---|---|---|---|
| 2014/0332875 A1* | 11/2014 | Kim | ................ | H01L 29/66833 257/324 |
| 2015/0008502 A1* | 1/2015 | Chien | ................ | H01L 27/1157 257/321 |
| 2015/0108562 A1* | 4/2015 | Chen | ................ | H01L 29/66833 257/324 |
| 2017/0148800 A1* | 5/2017 | Nishikawa | ........ | H01L 29/40117 |
| 2018/0033639 A1* | 2/2018 | Jung | ................ | H01L 21/30655 |
| 2018/0130972 A1* | 5/2018 | Sonoda | ............. | H01L 27/3246 |
| 2019/0296085 A1* | 9/2019 | Morooka | ............. | H01L 27/249 |

FOREIGN PATENT DOCUMENTS

| | | | |
|---|---|---|---|
| CN | 108511454 | A | 9/2018 |
| CN | 108831889 | A | 11/2018 |
| KR | 101056113 | B1 | 8/2011 |
| KR | 20130022744 | A | 3/2013 |
| KR | 20130044706 | A | 5/2013 |
| KR | 101584113 | B1 | 1/2016 |
| KR | 20180059271 | A * | 6/2018 |
| KR | 20180059271 | A | 6/2018 |
| TW | 201620077 | A | 6/2016 |
| TW | 201633510 | A | 9/2016 |
| TW | 201639206 | A | 11/2016 |
| TW | 201712912 | A | 4/2017 |
| TW | 201834207 | A | 9/2018 |
| WO | 2016025192 | A1 | 2/2016 |

OTHER PUBLICATIONS

Written Opinion of the International Searching Authority issued in corresponding International Application No. PCT/CN2018/116980, dated Aug. 21, 2019, 4 pages.

* cited by examiner

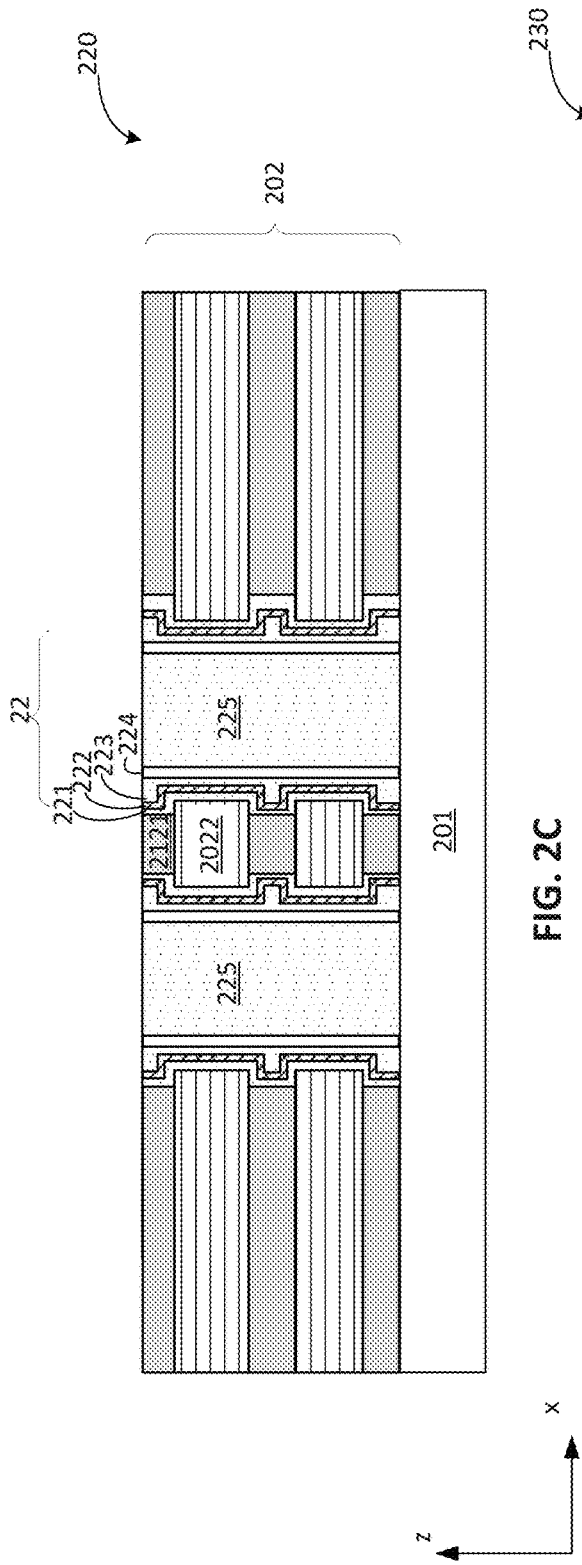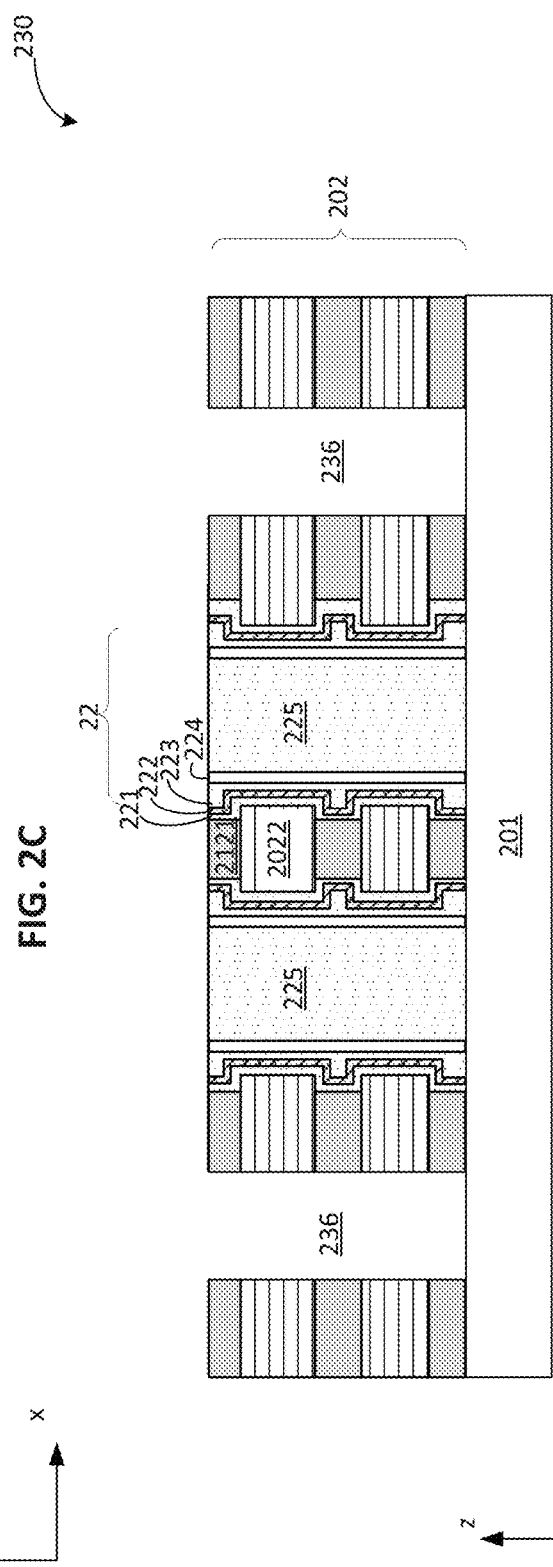
FIG. 2C
FIG. 2D

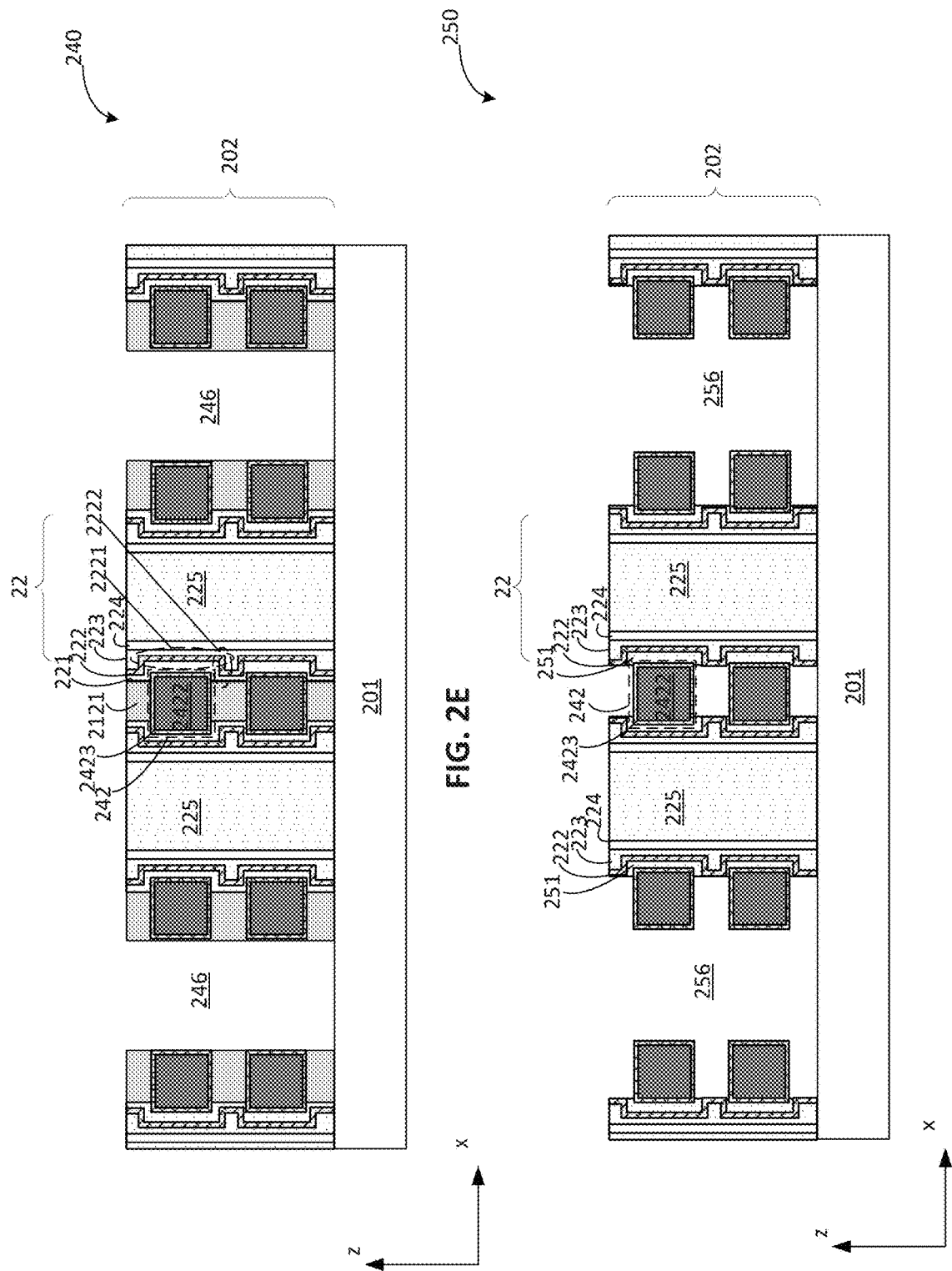

THREE-DIMENSIONAL MEMORY DEVICES AND FABRICATION METHODS THEREOF

CROSS REFERENCE TO RELATED APPLICATION

This application is continuation of International Application No. PCT/CN2018/116980, filed on Nov. 22, 2018, entitled "THREE-DIMENSIONAL MEMORY DEVICES AND FABRICATION METHODS THEREOF," which is hereby incorporated by reference in its entirety.

BACKGROUND

Embodiments of the present disclosure relate to three-dimensional (3D) memory devices and fabrication methods thereof.

Planar memory cells are scaled to smaller sizes by improving process technology, circuit design, programming algorithm, and fabrication process. However, as feature sizes of the memory cells approach a lower limit, planar process and fabrication techniques become challenging and costly. As a result, memory density for planar memory cells approaches an upper limit.

A 3D memory architecture can address the density limitation in planar memory cells. The 3D memory architecture includes a memory array and peripheral devices for controlling signals to and from the memory array.

SUMMARY

Embodiments of 3D memory devices and the fabrication methods to fabricate the 3D memory devices are disclosed herein.

In one example, a method for forming a 3D memory device includes the following operations. First, an initial channel hole in a structure is formed. The structure includes a plurality first layers and a plurality of second layers alternatingly arranged over a substrate. The structure can include any suitable structure for forming memory cells within. For example, the structure can include a staircase structure and/or a stack structure of a plurality of layers. An offset between a side surface of each one of the plurality of first layers and a side surface of each one of the plurality of second layers can be formed on a sidewall of the initial channel hole to form a channel hole. The channel hole with a channel-forming structure can be formed to form a semiconductor channel. The channel-forming structure can include a memory layer extending along a vertical direction. The plurality of second layers can then be replaced with a plurality of gate electrodes. A portion of the channel-forming structure can then be removed to divide the memory layer into a plurality of sub-memory portions, each sub-memory portion partially surrounding a respective gate electrode.

In another example, a method for forming a 3D memory device includes the following operations. First, a structure of a plurality first layers and a plurality of second layers can be formed. The structure can be alternatingly arranged over a substrate. A semiconductor channel can be formed in the structure, the semiconductor channel extending from a top surface of the structure to the substrate. The plurality of second layers can be replaced with a plurality of gate electrodes. The plurality of first layers can be removed and a sealing structure can be formed to insulate the plurality of gate electrodes from one another. A source structure can then be formed in the sealing structure. The source structure can extend from the top surface of the structure to the substrate.

In still another example, a 3D memory device includes a structure of a plurality of gate electrodes insulated by a sealing structure over a substrate, a semiconductor channel extending from a top surface of the structure to the substrate. The semiconductor channel can include a memory layer that has a plurality of sub-memory layers. Each one of the plurality of sub-memory layers can be disconnected from one another and partially surrounding a respective gate electrode. The 3D memory device can also include a source structure extending from the top surface of the structure to the substrate and between adjacent gate electrodes along a direction parallel to the top surface the substrate.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

FIGS. 2A-2I illustrate structures of a 3D memory device at various stages of an exemplary fabrication process, according to some embodiments of the present disclosure.

Figure 1:
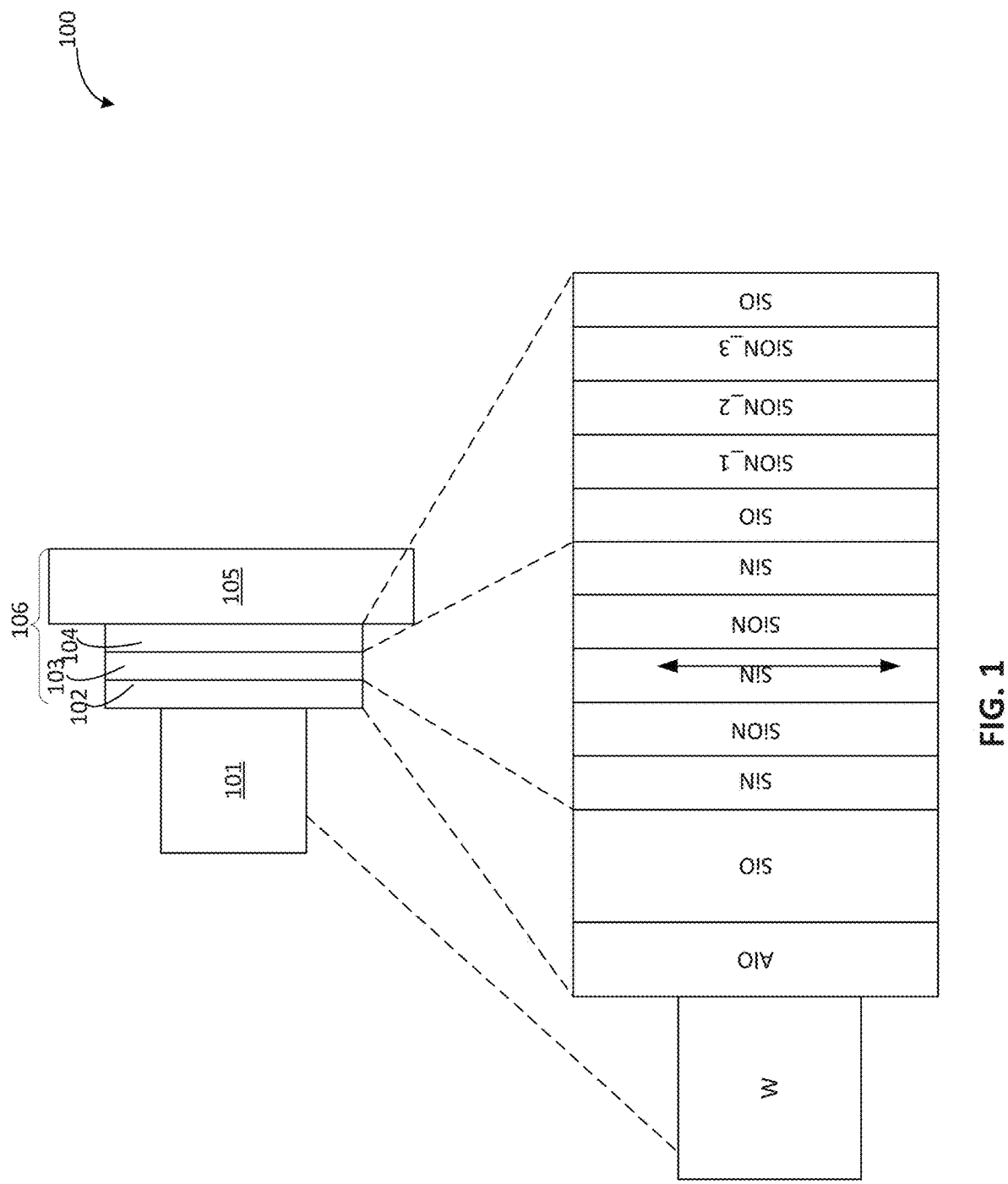
FIG. 1 illustrates a cross-sectional view of a portion of a 3D memory device.

Embodiments of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to effect such feature, structure or characteristic in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend laterally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which interconnect lines and/or via contacts are formed) and one or more dielectric layers.

As used herein, the term "nominal/nominally" refers to a desired, or target, value of a characteristic or parameter for a component or a process operation, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

As used herein, the term "3D memory device" refers to a semiconductor device with vertically oriented strings of memory cell transistors (referred to herein as "memory strings," such as NAND memory strings) on a laterally-oriented substrate so that the memory strings extend in the vertical direction with respect to the substrate. As used herein, the term "vertical/vertically" means nominally perpendicular to the lateral surface of a substrate.

As used herein, the terms "staircase," "step," and "level" can be used interchangeably. As used herein, a staircase structure refers to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A "staircase" refers to a vertical shift in the height of a set of adjoined surfaces.

As used herein, the x axis and the y axis (perpendicular to the x-z plane) extend horizontally and form a horizontal plane. The horizontal plane is substantially parallel to the top surface of the substrate. As used herein, the z axis extends vertically, i.e., along a direction perpendicular to the horizontal plane. The terms of "the x axis" and "the y axis" can be interchangeably used with "a horizontal direction," the term of "the x-y plane" can be interchangeably used with "the horizontal plane," and the term of "the z axis" can be interchangeably used with "the vertical direction."

In some 3D memory devices, a semiconductor channel is formed with a channel-forming structure, which includes a blocking layer, a memory layer, a tunneling layer, a semiconductor channel layer, and a dielectric core. Often, the blocking layer, the memory layer, the tunneling layer, and the semiconductor channel layer are sequentially arranged between a gate electrode and the dielectric core. Each one of the blocking layer, the memory layer, and the tunneling layer can include a single-layered structure or a multiple-layered structure. The blocking layer can reduce leakage of electrical charges. The memory layer can trap electric charges, which can tunnel into the semiconductor channel layer and can be transported in the semiconductor layer.

However, as more gate electrodes are stacked over the substrate (e.g., along a semiconductor channel) for higher memory capacity, charge loss becomes more prominent. For example, the memory layer can be more susceptible to charge loss as the number of gate electrodes increases. The charges trapped in the memory layer can be more likely to spread in the memory layer (e.g., along its extending direction.) As a result, data retention in the memory layer can be impaired, and operations (e.g., read, write, and/or hold) on the memory cells may have reduced precision.

It is understood that 3D memory device 100 can include additional components and structures not shown in FIG. 1 including, but not limited to, other local contacts and interconnects in one or more BEOL interconnect layers.

FIG. 1 illustrates a cross-section view of a portion of a 3D memory device 100. As shown in FIG. 1, a gate electrode 101 forms contact with a semiconductor channel. For viewing simplicity, a portion of semiconductor channel is depicted, shown as element 106. Semiconductor channel 106 has a blocking layer 102, a memory layer 103, a tunneling layer 104, and a p-channel 105, stacked sequentially along a direction (e.g., the x direction or the horizontal direction) substantially perpendicular to the direction p-channel 105 (e.g., or semiconductor channel 106) extends (e.g., the z direction or the vertical direction). P-channel 105? can include a semiconductor channel layer and a dielectric core, where the semiconductor channel layer is positioned between tunneling layer 104 and the dielectric core.

Gate electrode 101 can include any suitable conductive material such as tungsten (W). Each one of blocking layer 102, memory layer 103, and tunneling layer 104 can include a single-layered structure or a multiple-layered structure. For example, blocking layer 102 can include a high-k aluminum oxide (AlO or $Al_2O_3$) layer, a silicon oxide (SiO) layer, and/or a silicon oxynitride (SiON) layer sequentially stacked along the horizontal direction for reducing leakage of charges. Memory layer 103 can include a SiN layer, a SiON layer, a SiN layer, a SiON layer, and/or a SiN layer sequentially stacked along the horizontal direction for trapping charges. Tunneling layer 104 can include a SiO layer, one or more SiON layers (e.g., SiON_1, SiON_2, and SiON_3), and/or a SiO layer sequentially stacked along the horizontal direction for facilitating tunneling of charges from memory layer 103 to p-channel 105. The semiconductor channel layer can include a semiconductor layer such as poly-silicon for facilitating charge transport. The dielectric core can include a dielectric material such as silicon oxide to insulate each memory cell from one another.

As shown in FIG. 1, as the number of gate electrodes 101 increases along the vertical direction, charges trapped in memory layer 103 are more likely to spread along the vertical direction, as indicated by the arrow. Especially, charges are more likely to spread in the SiN layer, impairing the data retention of the 3D memory device. The impaired data retention can reduce the precision of operations (e.g., read, write, and/or hold) of the 3D memory device.

Various embodiments in accordance with the present disclosure provide the structures and fabrication methods of 3D memory devices, which resolve the above-noted issues associated with charge loss. For example, by changing the structure of the memory layer, charge spreading in the memory layer along its extending direction can be suppressed, improving charge confinement in the memory layer. Accordingly, data retention of the 3D memory device can be improved. In some embodiments, the memory layer can have portions aligned with its extending direction (e.g., portions extending horizontally.) For example, the memory layer can have a plurality of sub-memory layers disconnected from one another along the extending direction of the memory layer. This configuration can suppress the charges trapped in the memory cell to spread in the memory cell along its extending direction, increasing the data retention in the 3D memory device.

In some embodiments, portions of the blocking layer and/or portions of the tunneling layer are removed. In some embodiments, portions of the blocking layer and/or portions of the tunneling layer are moved as a result of the fabrication process to disconnect the memory layer and form sub-memory layers of the memory layer. In some embodiments, terminals of the sub-memory layers of the memory layer are reduced or partially removed to further suppress charge spreading along the direction the memory layer extends. Each memory cell, formed based on the respective sub-memory layer of the memory layer, can be insulated from one another by an insulating structure, facilitating the proper functioning of the memory cell. Thus, the 3D memory device formed employing the disclosed methods can have improved data retention and thus better operating precision.

Figure 2A:
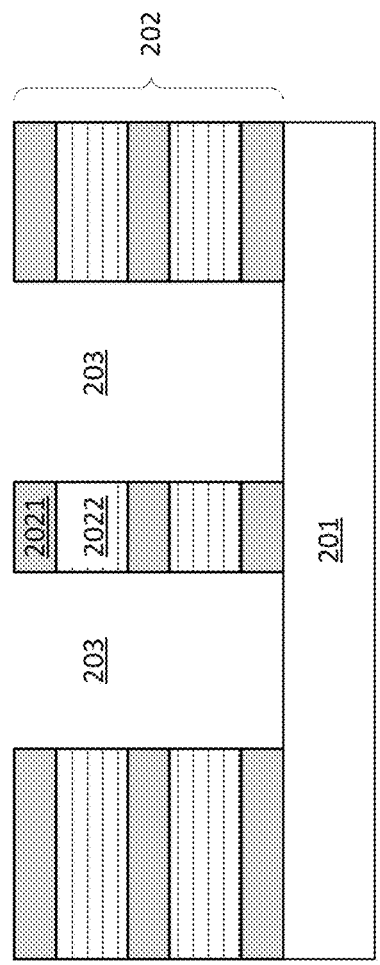
Figure 2B:
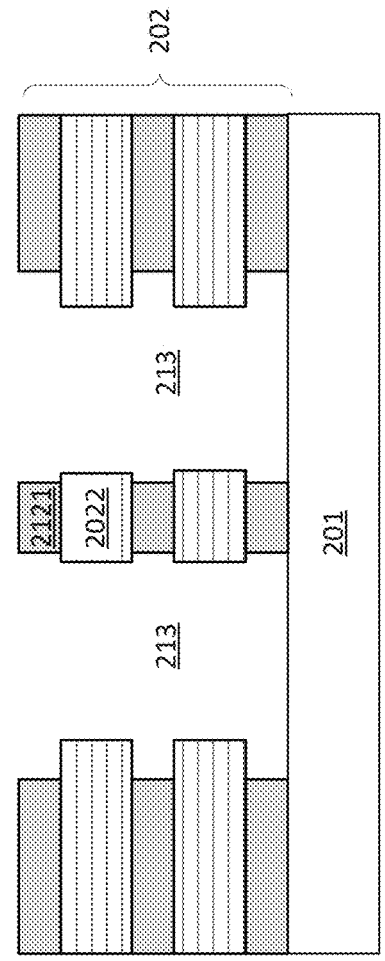
Figure 2G:
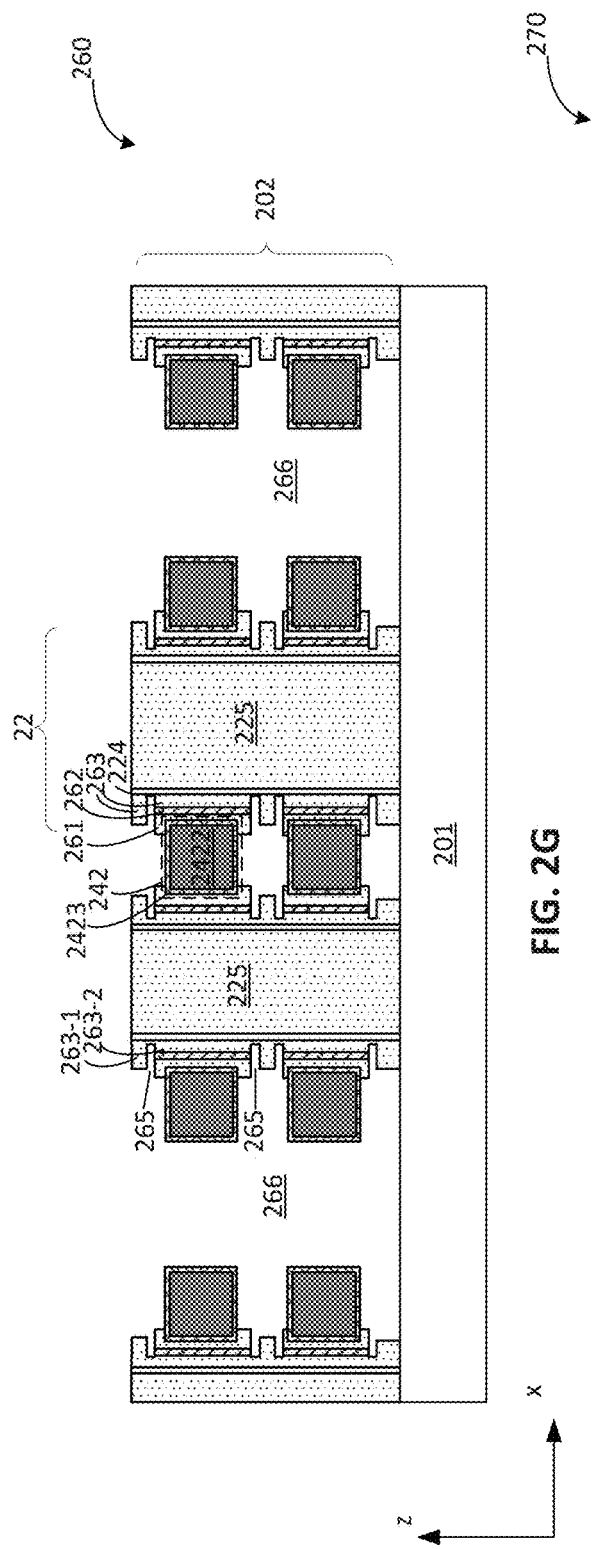
Figure 2H:
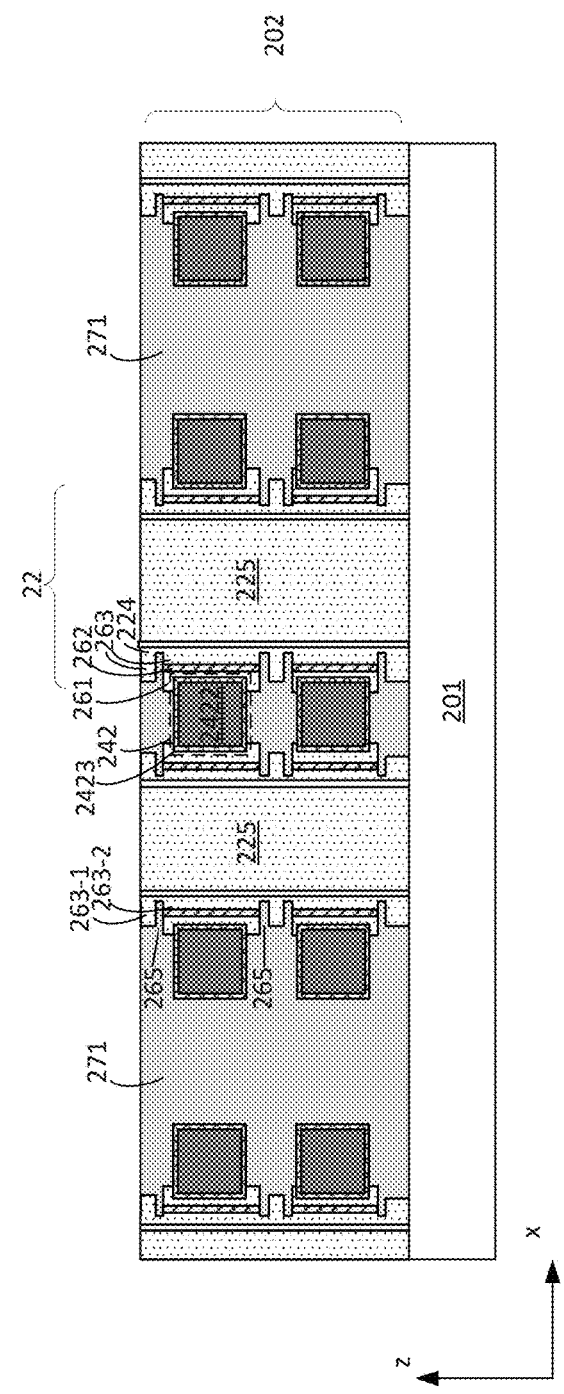
Figure 2I:
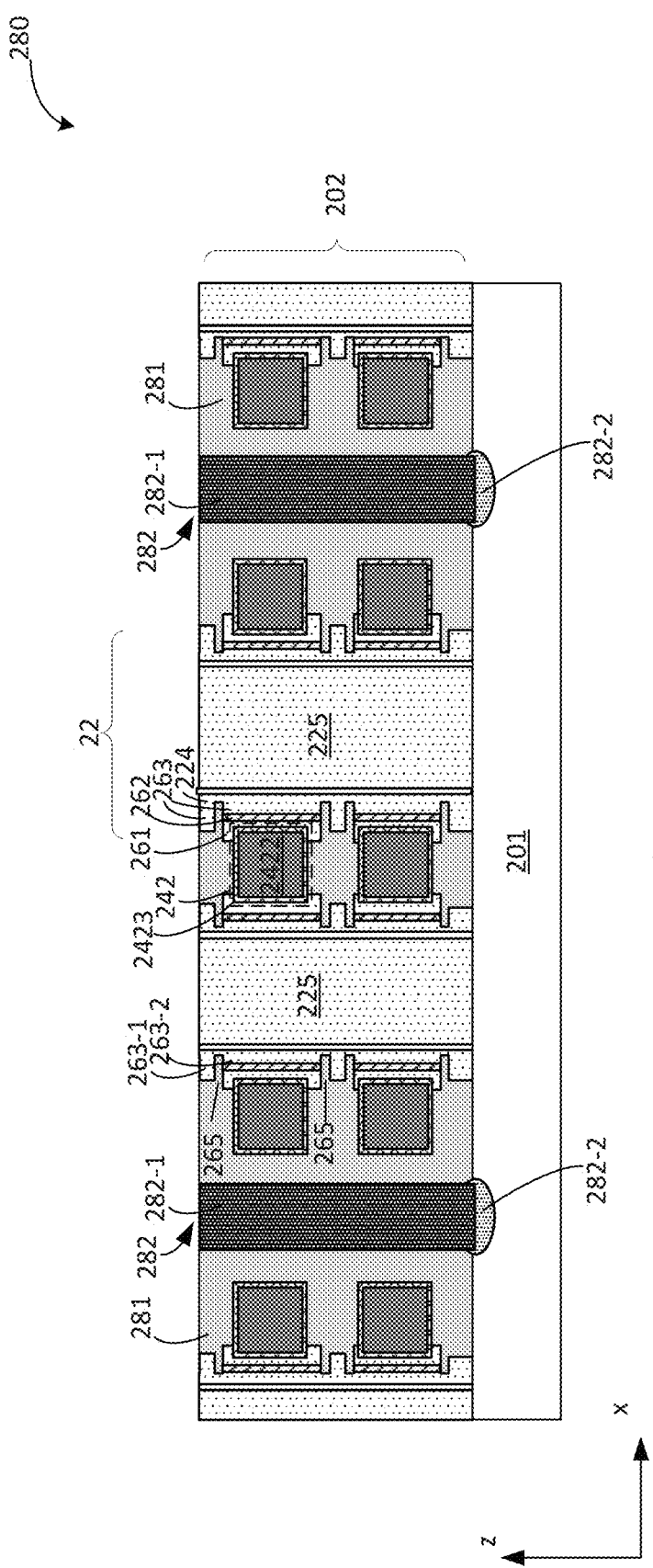
Figure 3:
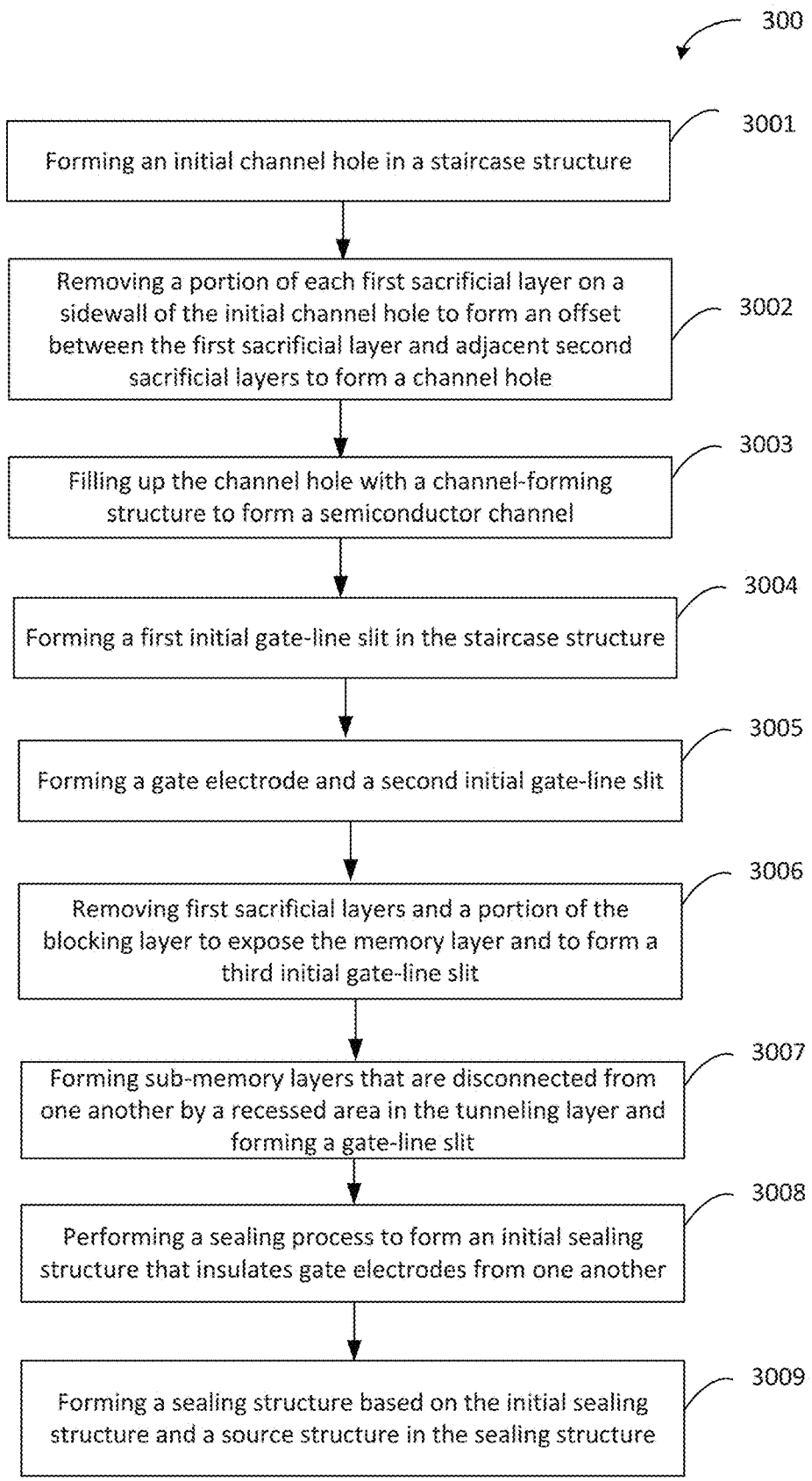
FIG. 3 illustrates a flowchart of an exemplary method for forming a 3D memory device, according to some embodiments of the present disclosure.

FIGS. 2A-2I illustrate structures 200-280 of an exemplary 3D memory device at various stages of an exemplary fabrication process, according to embodiments of the present disclosure. FIG. 3 illustrates an exemplary fabrication process 300 to form the 3D memory device illustrated in FIGS. 2A-2I.

Referring to FIG. 3, at the beginning of the fabrication process, an initial channel hole can be formed in a staircase structure (Operation 3001). FIG. 2A illustrates a cross-sectional view of a corresponding structure 200.

As shown in FIG. 2A, an initial channel hole 203 can be formed in a staircase structure 202, which is formed over a substrate 201. Substrate 201 can include silicon (e.g., single crystalline silicon), silicon germanium (SiGe), gallium arsenide (GaAs), germanium (Ge), silicon on insulator (SOI), and/or any other suitable materials. In some embodiments, substrate 201 includes silicon.

Staircase structure 202 can provide the fabrication base for the formation of a stacked storage structure. Memory strings (e.g., NAND memory strings) can be subsequently formed in staircase structure 202. In some embodiments, staircase structure 202 includes a plurality of first sacrificial layer 2021/second sacrificial layer 2022 pairs stacked vertically over substrate 201. Each first sacrificial layer 2021/second sacrificial layer 2022 pair can include a first sacrificial layer 2021 and a second sacrificial layer 2022. That is, staircase structure 202 can include interleaved first sacrificial layers 2021 and second sacrificial layers 2022 stacked along the vertical direction. The number of first sacrificial layer 2021/second sacrificial layer 2022 pairs in staircase structure 202 (e.g., 32, 64, 96, or 128) can set the number of memory cells in the 3D memory device.

First sacrificial layers 2021 can each have the same thickness or have different thicknesses. Similarly, second sacrificial layers 2022 can each have the same thickness or have different thicknesses. Second sacrificial layers 2022 can include any suitable materials that are different from the material of first sacrificial layers 2021. In some embodiments, first sacrificial layer 2021 includes one or more of poly-silicon and carbon. In some embodiments, second sacrificial layer 2022 includes SiN. In some embodiments, each stair or step includes a first sacrificial layer 2021 and a corresponding second sacrificial layer 2022.

The formation of first sacrificial layer 2021/second sacrificial layer 2022 can be formed by repetitive etching of a stack of first sacrificial material layer/second sacrificial material layer pairs using an etch mask (e.g., a photoresist layer) over the stack. The etch mask can expose the portion of first sacrificial layer 2021/second sacrificial layer 2022 pair to be etched so that the exposed portion can be etched using a suitable etching process. The etching of the etch mask and the stack can be performed using any suitable etching processes such as wet etch and/or dry etch. In some embodiments, the etching includes dry etch, e.g., inductively coupled plasma etching (ICP) and/or reactive-ion etch (RIE).

An initial channel hole 203 can be formed in staircase structure 202. In some embodiments, initial channel hole 203 extends from a top surface of staircase structure 202 to substrate 201. In some embodiments, a bottom portion of initial channel hole 203 exposes substrate 201. Initial channel hole 203 can be formed by any suitable fabrication process. For example, a patterned photoresist layer can be formed over staircase structure 202. The patterned photoresist layer can expose a portion of staircase structure 202 for forming initial channel hole 203. A suitable etching process can be performed to remove the portion of staircase structure 202 until substrate 201 is exposed. The etching process can include a dry etch and/or a wet etch such as inductively coupled plasma (ICP) etching process.

Referring to FIG. 3, after the formation of the initial channel hole, a portion of each first sacrificial layer on a sidewall of the initial channel hole can be removed to form an offset between the first sacrificial layer and adjacent second sacrificial layers to form a channel hole (Operation 3002). FIG. 2B illustrates a cross-sectional view of a corresponding structure 210.

As shown in FIG. 2B, a portion of each first sacrificial layer 2021 on the sidewall of initial channel hole 203 can be removed to form channel hole 213. For ease of description, the surface of first sacrificial layer 2021 (or second sacrificial layer 2022) facing initial channel hole 203 or channel hole 213 is referred to as a side surface of first sacrificial layer 2021 (or second sacrificial layer 2022). In an embodiment, a recess region can be formed on the side surface of first sacrificial layer 2021. First sacrificial layer 2021 after the recess etch can be referred to as recessed-first sacrificial layer 2121. The dimension or thickness of the removed portion (e.g., along the horizontal direction) of first sacrificial layer 2021 can be any suitable value that allows an offset to be formed between the side surface of second sacrificial layer 2022 and recessed-first sacrificial layer 2121. In some embodiments, the side surfaces of second sacrificial layers 2022 form protrusions along the vertical direction (or the sidewall of channel hole 213.) Any suitable selective etching process (e.g., a recess etch) can be performed to form recessed-first sacrificial layers 2121. In some embodiments, the selective etching process has a high etching selectivity on recessed-first sacrificial layers 2121 over second sacrificial layers 2022, causing little or no damage on second sacrificial layers 2022. A wet etch and/or a dry etch can be performed as the selective etching process. In some embodiment, a reactive ion etch (RIE) process is performed as the selective etching process.

In some embodiments, instead of moving a portion of the side surface of each first sacrificial layer 2021, a portion of the side surface of each second sacrificial layer 2022 is removed to form an offset between a recessed-second sacrificial layer and adjacent first sacrificial layers 2021. Accordingly, protrusions of side surfaces of first sacrificial layers 2021 can extend along the vertical direction.

Referring to FIG. 3, after the formation of the channel hole, a channel-forming structure is formed to fill up the channel hole, and a semiconductor channel is formed (Operation 3003). FIG. 2C illustrates a cross-sectional view of a corresponding structure 220.

As shown in FIG. 2C, a semiconductor channel 22 can be formed by filling channel hole 213 with a channel-forming structure. The channel-forming structure can include a blocking layer 221, a memory layer 222, a tunneling layer 223, a semiconductor layer 224, and a dielectric core 225, positioned sequentially from the sidewall surface of channel hole 213 towards the center of channel hole 213.

Blocking layer 221 can reduce or prevent charges from escaping into the subsequently formed gate electrodes. Blocking layer 221 can include a single-layered structure or a multiple-layered structure. For example, blocking layer 221 can include a first blocking layer and a second blocking layer. The first blocking layer can be formed over the surface of channel hole 213 by any suitable conformal deposition method. The first blocking layer can include a dielectric material (e.g., a dielectric metal oxide.) For example, the first blocking layer can include a dielectric metal oxide having a sufficiently high dielectric constant (e.g., greater than 7.9.) Examples of the first blocking layer include AlO, hafnium oxide ($HfO_2$), lanthanum oxide ($LaO_2$), yttrium oxide ($Y_2O_3$), tantalum oxide ($Ta_2O_5$), silicates thereof, nitrogen-doped compounds thereof, and/or alloys thereof. The first blocking layer can be formed by a suitable deposition method such as chemical vapor deposition (CVD), atomic layer deposition (ALD), pulsed laser deposition (PLD), and/or liquid source misted chemical deposition. In some embodiments, the first blocking layer includes AlO.

The second blocking layer can be formed over the first blocking layer and can include a dielectric material that is different from the first blocking layer. For example, the second blocking layer can include silicon oxide, silicon oxynitride, and/or silicon nitride. In some embodiments, the second blocking layer includes silicon oxide, which can be formed by any suitable conformal deposition method such as low pressure CVD (LPCVD), and/or ALD.

Memory layer 222 can include a charge-trapping material and can be formed over blocking layer 221. Memory layer 222 can include a single-layered structure or a multiple-layered structure. For example, memory layer 222 can include conductive materials and/or semiconductor such as tungsten, molybdenum, tantalum, titanium, platinum, ruthenium, alloys thereof, nanoparticles thereof, silicides thereof, and/or polycrystalline or amorphous semiconductor materials (e.g., polysilicon and amorphous silicon.) Memory layer 222 can also include one or more insulating materials such as SiN and/or SiON. In some embodiments, memory layer 222 includes a SiN layer sandwiched by SiON layers, which are further sandwiched by SiN layers. Memory layer 222 can be formed by any suitable deposition method such as CVD, ALD, and physical vapor deposition (PVD).

Tunneling layer 223 can include a dielectric material through which tunneling can occur under a suitable bias. Tunneling layer 223 can be formed over memory layer 222 and can include a single-layered structure or a multiple-layered structure and can include SiO, SiN, SiON, dielectric metal oxides, dielectric metal oxynitride, dielectric metal silicates, and/or alloys thereof. Tunneling layer 223 can be formed by a suitable deposition method such as CVD, ALD, and/or PVD. In some embodiments, tunneling layer 223 includes a plurality of SiON layers and a SiO layer, wherein the plurality of SiON layers is positioned between memory layer 222 and the SiO layer.

Semiconductor layer 224 can facilitate transport of charges and can be formed over tunneling layer 223. Semiconductor layer 224 can include one or more semiconductor materials such as a one-element semiconductor material, a III-V compound semiconductor material, a II-VI compound semiconductor material, and/or an organic semiconductor material. Semiconductor layer 224 can be formed by any suitable deposition method such as LPCVD, ALD, and/or metal-organic chemical vapor deposition (MOCVD). In some embodiments, semiconductor layer 224 includes a poly-silicon layer.

Dielectric core 225 can include a suitable dielectric material and can fill up the space in surrounded by semiconductor layer 224. In some embodiments, dielectric core 225 includes SiO (e.g., SiO of sufficiently high purity) and can be formed by any suitable deposition method such as CVD, LPCVD, ALD, and/or PVD.

Because of the offsets between the side surfaces of recessed-first sacrificial layers 2121 and sacrificial layers 2022, memory layer 222 can include portions aligned along different directions than the vertical direction. In some embodiments, memory layer 222 includes one or more of vertical portions 2221 (e.g., substantially aligned along the vertical direction) and one or more non-vertical portions 2222 (e.g., horizontal portions that are substantially aligned along the horizontal direction) connected with one another.

When the subsequently-formed 3D memory device (i.e., formed with memory layer 222) is in operation, a bias can be applied on the gate electrode, and charges can be trapped in memory layer 222. Because of the non-vertical portions 2222 of memory layer 222, the spreading of charges in memory layer 222 along the vertical direction can be reduced or eliminated. Retention of charges in memory layer 222 can be improved.

Referring to FIG. 3, after the formation of the semiconductor channel, a first initial gate-line slit can be formed in the staircase structure (Operation 3004). FIG. 2D illustrates a cross-sectional view of a corresponding structure 230.

As shown in FIG. 2D, first initial gate-line slit 236 can be formed in staircase structure 202. In some embodiments, first initial gate-line slit 236 extends along a direction perpendicular to the x-z plane (e.g., the y axis) and divide semiconductor channels 32 into blocks along the y axis. First initial gate-line slit 236 can extend from a top surface of staircase structure 202 to substrate 201. In some embodiments, first initial gate-line slit 236 exposes substrate 201. First initial gate-line slit 236 can be formed by any suitable method. For example, first initial gate-line slit 236 can be formed by etching of staircase structure 202 using an etch mask (e.g., a patterned photoresist layer). The etch mask can expose a portion of staircase structure 202 that corresponds to a location of first initial gate-line slit 236. A suitable etching process (e.g., dry etch and/or wet etch) can be performed to remove the exposed portion of staircase structure 202 until substrate 201 is exposed. In some embodiments, an ICP etching process is performed to form first initial gate-line slit 236.

In some embodiments, elements 2021 and 2022 represent first sacrificial material layer and second sacrificial material layer, and staircase structure 202 represents a stack structure. In this case, stack structure 202 can be etched/patterned repetitively to form stairs, where each stair can include a first sacrificial layer/and a second sacrificial layer pair. The first sacrificial layer and the second sacrificial layer can each be formed by the etching/patterning of stack structure 202. The formation of first sacrificial layer/second sacrificial layer pairs can be formed at any suitable stage before the formation of the gate electrodes. The specific order to form the staircases, the semiconductor channels, and the gate electrodes should not be limited by the embodiments of the present disclosure.

Referring to FIG. 3, after the formation of first initial gate-line slit, a gate electrode and a second initial gate-line slit can be formed (Operation 3005). FIG. 3E illustrates a cross-sectional view of a corresponding structure 240.

As shown in FIG. 2E, second sacrificial layers 2022 can be removed and gate electrodes 242 can be formed. Gate electrode 242 can include a conductor layer 2422 surrounded by an insulating spacer layer 2423. Second sacrificial layers 2022 can be removed by any suitable etching process (e.g., wet etch and/or dry etch). In some embodiments, second sacrificial layers 2022 are removed by a wet etch process to form gate-forming tunnels. An insulating spacer layer 2423 can then be deposited on the sidewalls of the gate-forming tunnels. In some embodiments, the formation of insulating spacer layer 2423 includes deposition of a high-k dielectric material (such as AlO, $HfO_2$, and/or $Ta_2O_5$) or a dielectric material (SiO, SiN, and/or SiON) over the sidewall of the gate-forming tunnels and an adhesive layer (such as titanium nitride (TiN)) over the high-k dielectric material. A conductive material can then be deposited over insulating spacer layers 2423 to fill up the gate-forming tunnels and form conductor layers 2422. Conductor layers 2422 can include conductive materials including, but not limited to, tungsten (W), cobalt (Co), copper (Cu), aluminum (Al), polycrystalline silicon (polysilicon), doped silicon, silicides, or any combination thereof. In some embodiments, conductor layers 2422 include metals, such as W, and insulating spacer layers 2423 include SiO. Conductor layers 2422 and SiO can each be formed by any suitable deposition method such as CVD, ALD and/or in-situ steam generation (ISSG).

A recess etch can be performed to remove any excessive materials that form insulating spacer layer 2423 and conductor layers 2422 in first initial gate-line slit 236. For example, excessive material of insulating spacer layer 2423 and conductive material can be removed from recessed-first sacrificial layers 2121 and substrate 201 at the bottom of first initial gate-line slit 236. Second initial gate-line slit 246 that exposes substrate 201 can be formed. In some embodiments, portions of insulating spacer layer 2423 can be removed to expose conductor layers 2422 on the sidewall of second initial gate-line slit 246. The recess etch can include any suitable etching process (e.g., wet etch and/or dry etch). In some embodiments, the recess etch includes a wet etch process.

In some embodiments, element 2021 represents a sacrificial layer and element 2022 represents a conductor layer. For example, staircase structure 202 can include a plurality of sacrificial layer 2021/conductor layer 2022 pairs stacked vertically over substrate 201. Different from the fabrication operations described in FIGS. 2A-2E, the plurality of conductor layers 2022 may retain to form gate electrodes 242. For example, an insulating spacer layer 2423 can be formed over conductor layers 2022 after sacrificial layers 2021 are removed (e.g., in operation 3006.) Conductor layers 2022 can include any suitable material that is different from sacrificial layers 2021. In some embodiments, conductor layers 2022 include poly-silicon.

Referring to FIG. 3, after the formation of gate electrodes and second initial gate-line slit, first sacrificial layers and a portion of the blocking layer can be removed to expose the memory layer, and a third initial gate-line slit can be formed (Operation 3006). FIG. 2F illustrates a cross-sectional view of a corresponding structure 250.

As shown in FIG. 2F, recessed-first sacrificial layers 2121 and a portion of blocking layer 221 can be removed to expose memory layer 222 and substrate 201, and third initial gate-line slit 256 can be formed. In some embodiments, the portion of blocking layer 221 can be removed to expose the vertical portion of memory layer 222. The remaining portion of blocking layer 221 can be depicted as a disconnected blocking layer 251 in FIG. 2F. Third initial gate-line slit 256 can then expose the gate electrodes 242, the vertical portion of memory layer 222, and substrate 201.

One or more etching processes can be performed to remove recessed-first sacrificial layers 2121 and the portion of blocking layer 221. The etching processes can have sufficiently high etching selectivity of recessed-first sacrificial layers 2121 and/or blocking layer 221 over memory layer 222. For example, memory layer 222 can function as an etch-stop layer so the sidewall of semiconductor channel 22 has little or no damage from the formation of third initial gate-line slit 256. In some embodiments, disconnected blocking layer 251 has sufficient thickness to surround gate electrode 242 and insulate gate electrode 242 from memory layer 222. The one or more etching processes can include any suitable etching processes such as a dry etch and/or a wet etch.

Referring to FIG. 3, after the formation of third initial gate-line slit, sub-memory layers that are disconnected from one another can be formed by a recessed area in the tunneling layer, and a gate-line slit can be formed (Operation 3007). FIG. 2G illustrates a cross-sectional view of a corresponding structure 260.

As shown in FIG. 2G, sub-memory layers 262 of memory layer 222 can be formed to partially surround the respective gate electrode 242. A recessed area 265 can be formed in tunneling layer 223 a terminal of sub-memory layer 262 to disconnect sub-memory layer 262 from one another. Gate-line slit 266 can be formed accordingly. In some embodiments, recess area 265 is formed in tunneling layer 223 between a first portion 263-1 and a second portion 263-2 (e.g., together forming recessed tunneling layer 263.) First portion 263-1 can have little or no contact with sub-memory layer 262, and second portion 263-2 can form contact with respective sub-memory layer 262 and can be positioned between sub-memory layer 262 and semiconductor layer 224. Side surfaces of disconnected blocking layer 251 and/or tunneling layer 223 are reduced or etched during the formation of sub-memory layer 262, and thus may or may not be coplanar with one another along the vertical direction (e.g., the z axis.) Blocking layer 261 may or may not be the same as blocking layer 221 after the formation of sub-memory layer 262. In some embodiments, sub-memory layer 262 extends along the direction perpendicular to the top surface of substrate 201 (e.g., the z axis or the direction memory layer 222 extends.) Memory-sub layer 262 may or may not include a portion extending along a non-vertical direction (e.g., a direction not parallel with the z axis) For example, memory-sub layer 262 may include a vertical portion, and may or may not include a horizontal portion. In some embodiments, memory layer 222 is divided into a plurality of sub-memory layers 262 by recessed area 265 at each terminal of sub-memory layers 262. In some embodiments, first portion 263-1 is located between adjacent sub-memory layers 262 (or adjacent gate electrodes 242) along the vertical direction (e.g., z axis.)

Gate-line slit 266, recessed area 265, and sub-memory layer 262 can be formed by any suitable etching processes (e.g., a recess etch.) In some embodiments, the etching process includes an isotropic etch (e.g., dry etch and/or wet etch.) that etches disconnected blocking layer 251, memory layer 222, and tunneling layer 223 at the same time. In some embodiments, the etching process has a higher etching selectivity of the memory layer than other structures/layers (e.g., insulating spacer layer 2423, disconnected blocking layer 251, and tunneling layer 223.) In some embodiments, the etching time of the memory layer is controlled to ensure a sufficient portion of disconnected blocking layer 251 can remain to provide insulation between sub-memory layer 262 and gate electrode 242. In some embodiments, memory layer 222 and tunneling layer 223 are etched differently. For example, portions of memory layer 222 at the terminals of memory layer 222 can be removed, and a recess etch can be performed to further remove a portion of tunneling layer 223 in the space formed by the removal of portions of memory layer 222. Recessed areas 265 can ensure sub-memory layers 262 are disconnected from one another. In some embodiments, portions of memory layer 222 that extend along a non-vertical direction are removed. For example, non-vertical portion 2222 (e.g., horizontal portion) of memory layer 222 can be removed, and vertical portion 2221 of memory layer 222 can be retained.

Referring to FIG. 3, after the formation of gate-line slit and sub-memory layer, a sealing process can be performed to form an initial sealing structure that insulates gate electrodes from one another (Operation 3008). FIG. 2H illustrates a cross-sectional view of a corresponding structure 270.

As shown in FIG. 2H, an initial sealing structure 271 can be formed to insulate each gate electrode from one another. The portion of initial sealing structure 271 surrounding each gate electrode can be sufficiently thick to ensure the surrounded gate electrode 242 (e.g., along the horizontal direction and the vertical direction) is insulated from other structures (e.g., other gate electrodes 242.) In some embodiments, initial sealing structure 271 fills up the space of gate-line slit 266 and forms an interlayer dielectric layer between adjacent gate electrodes 242. In some embodiments, initial sealing structure 271 covers the exposed disconnected blocking layer 261, sub-memory layer 262, first and second portions of recessed tunneling layer 263, recessed areas 265, and the top surface of semiconductor channel 22.

A sealing process can be performed to form initial sealing structure 271 that fills up gate-line slit 266 to insulate gate electrodes 242 from one another. The initial sealing structure may also cover the exposed disconnected blocking layer 251, memory layer 222, recessed tunneling layer 263, and the top surface of semiconductor channel 22. In some embodiments, initial sealing structure 271 is formed by any suitable deposition method that deposits an insulating material over gate electrodes 242 and fills up gate-line slit 266. The insulating material may include any suitable material (e.g., dielectric material) that provides electrical insulation between adjacent gate electrodes 242 and between gate electrode 242 and the subsequently-formed source structure. In some embodiments, initial sealing structure 271 is formed by a CVD and includes silicon oxide. Optionally, a planarization/recess etch process can be performed or remove excessive portions of the initial sealing structure over semiconductor channels 22 and/or gate electrodes 242.

Referring to FIG. 3, after the initial sealing structure is formed, a sealing structure can be formed based on the initial sealing structure and a source structure can be formed in the sealing structure (Operation 3009). FIG. 2I illustrates a cross-sectional view of a corresponding structure 280.

As shown in FIG. 2I, a source structure 282 can be formed in sealing structure 281 (e.g., between adjacent gate electrodes 242 and can extend along a direction perpendicular to the x-z plane (e.g., the y axis).) Source structure 282 can include a conductor portion 282-1 and a doped semiconductor portion 282-2. Doped semiconductor portion 282-2 can be formed in substrate 201, contacting conductor portion 282-1. Source structure 282 may be insulated from neighboring gate electrodes 242 by initial sealing structure 271. Conductor portion 282-1 may include any suitable conductive material that can be used as the source electrode, and doped semiconductor portion 282-2 may include a suitable doped (e.g., P type or N type) semiconductor region formed in substrate 201 and is opposite from the polarity of substrate 201. In some embodiments, conductor portion 282-1 includes one or more of doped poly-silicon, copper, aluminum, cobalt, doped silicon, silicides, and tungsten. In some embodiments, doped semiconductor portion 282-2 includes doped silicon.

Source structure 282 can be formed by filling up a source trench in initial sealing structure 271. The source trench can be formed by performing a patterning/etching process in initial sealing structure 271. In an example, a patterned photoresist layer can be formed over initial sealing structure 271. The patterned photoresist layer may have an opening that exposes the area where the source trench is subsequently formed. An etching process (e.g., a recess etching process) may be performed (e.g., using the patterned photoresist layer as an etch mask) to remove the portion of initial sealing structure 271 exposed by the opening to expose substrate 201. The source trench and sealing structure 281 can be formed accordingly. The etching process can also be referred to as a "bottom punch through" process and can include any etching process that can remove initial sealing structure 271. In some embodiments, the etching process includes an anisotropic dry etching process.

Source structure 282 may be formed by the following process. After the source trench is formed, an ion implantation may be performed to implant ions/dopants into the portion of substrate 201 exposed at the bottom of the source trench. The portion of substrate 201 doped by the ion implantation process can form doped semiconductor portion 282-2. In some embodiments, substrate 201 includes silicon and doped semiconductor portion 282-2 includes doped silicon. Conductor portion 282-1 can then be formed by filling the source trench with a suitable conductor material such as doped poly-silicon, copper, aluminum, and/or tungsten by a suitable deposition process such as CVD, ALD, PVD, etc. Optionally, a planarization/recess etch process can be performed to remove excessive portions of the conductor material over semiconductor channels 32 and/or gate electrodes 242. In some embodiments, source structure 282 is referred to as an array common source ("ACS".)

In some embodiments, the disclosed 3D memory device is part of a monolithic 3D memory device, in which the components of the monolithic 3D memory device (e.g., memory cells and peripheral devices) are formed on a single substrate (e.g., substrate 201). Peripheral devices such as any suitable digital, analog, and/or mixed-signal peripheral circuits used for facilitating the operation of the disclosed 3D memory device, can be formed on the substrate as well, outside of memory stack (e.g., memory stack formed in staircase structure 202). The peripheral device can be formed "on" the substrate, where the entirety or part of the peripheral device is formed in the substrate (e.g., below the top surface of the substrate) and/or directly on the substrate. Peripheral device can include one or more of a page buffer, a decoder (e.g., a row decoder and a column decoder), a sense amplifier, a driver, a charge pump, a current or voltage reference, or any active or passive components of the circuits (e.g., transistors, diodes, resistors, or capacitors). Isolation regions (e.g., shallow trench isolations (STIs)) and doped regions (e.g., source regions and drain regions of the transistors) can be formed in the substrate as well, outside of the memory stack.

In some embodiments, a method for forming a 3D memory device includes the following operations. First, an initial channel hole in a staircase structure is formed. The staircase structure includes a plurality first layers and a plurality of second layers alternatingly arranged over a substrate. An offset between a side surface of each one of the plurality of first layers and a side surface of each one of the plurality of second layers can be formed on a sidewall of the initial channel hole to form a channel hole. The channel hole with a channel-forming structure can be formed to form a semiconductor channel. The channel-forming structure can include a memory layer extending along a vertical direction. The plurality of second layers can then be replaced with a plurality of gate electrodes. A portion of the channel-forming structure can then be removed to divide the memory layer into a plurality of sub-memory portions, each sub-memory portion partially surrounding a respective gate electrode.

In some embodiments, forming the initial channel hole in the staircase structure includes forming a patterned photoresist layer over the staircase structure to expose an opening that corresponds to a location of the initial channel hole, and removing a portion of the staircase structure exposed by the opening to expose the substrate.

In some embodiments, forming the offset includes removing a portion of the side surface of each one of the plurality of first layers on the sidewall of the initial channel hole.

In some embodiments, removing the portion of the side surface of each one of the plurality of first layers includes performing a recess etching process that selectively etches the plurality of first layers to the plurality of second layers.

In some embodiments, filling the channel hole with the channel-forming structure includes the following operations. First, a blocking layer can be formed over a sidewall of the channel hole. The memory layer can be formed over the blocking layer, a tunneling layer can be formed over the memory layer, and a semiconductor layer can be formed over the tunneling layer. Further, a dielectric core can be formed over the semiconductor layer to fill up the channel hole.

In some embodiments, forming the blocking layer includes depositing at least one of a first blocking layer and a second blocking layer. The first blocking layer can include one or more of aluminum oxide (AlO), hafnium oxide (HfO$_2$), lanthanum oxide (LaO$_2$), yttrium oxide (Y$_2$O$_3$), tantalum oxide (Ta$_2$O$_5$), silicates thereof, nitrogen-doped compounds thereof, and alloys thereof. The second blocking layer can include one or more of silicon oxide, silicon oxynitride, and silicon nitride. Forming the memory layer can include depositing a charge-trapping material that includes at least one of tungsten, molybdenum, tantalum, titanium, platinum, ruthenium, alloys thereof, nanoparticles thereof, silicides thereof, polysilicon, amorphous silicon, SiN, and SiON. Forming the tunneling layer can include deposing at least one of SiO, SiN, SiON, dielectric metal oxides, dielectric metal oxynitride, dielectric metal silicates, and alloys thereof. Forming the semiconductor layer can include depositing a one-element semiconductor material, a III-V compound semiconductor material, a II-VI compound semiconductor material, and/or an organic semiconductor material. Forming the dielectric core can include depositing SiO.

In some embodiments, the method further includes alternatingly depositing a plurality of first material layers and a plurality of second material layers over the substrate to form a stack structure over the substrate, and repetitively etching the plurality of first material layers and the plurality of second material layers along the vertical direction to respectively form the plurality of first layers and the plurality of second layers.

In some embodiments, alternatingly depositing the plurality of first material layers and the plurality of second material layers includes alternatingly depositing a plurality of first sacrificial material layers and a plurality of second sacrificial material layers, the plurality of first sacrificial material layers having a different material than the plurality of second sacrificial material layers.

In some embodiments, depositing the plurality of first sacrificial material layers includes depositing a plurality of one or more of polysilicon layers and carbon layers, and depositing the plurality of second sacrificial material layers includes depositing a plurality of SiN layers.

In some embodiments, the method further includes forming a first initial gate-line slit in the staircase structure neighboring the semiconductor channel.

In some embodiments, forming the first initial gate-line slit includes forming another patterned photoresist layer over the staircase structure to expose another opening that corresponds to a location of the first initial gate-line slit, and removing another portion of the staircase structure exposed by the other opening to expose the substrate.

In some embodiments, the method further includes removing the plurality of second layers to form a plurality of gate-forming tunnels, forming an insulating spacer layer over a sidewall of each one of the plurality of gate-forming tunnels, and forming a conductor layer over the insulating spacer layer to fill up the plurality of gate-forming tunnels to form the plurality of gate electrodes.

In some embodiments, removing the plurality of second layers includes performing a wet etching process.

In some embodiments, forming the insulating spacer layer includes depositing a layer of high-k dielectric material having one or more of AlO, $HfO_2$, and $Ta_2O_5$, and forming the conductor layer includes depositing a layer of one or more of W, Co, Cu, Al, polysilicon, doped silicon, silicides, and a combination thereof.

In some embodiments, the method further includes removing excessive materials of the insulating spacer layer and the conductor layer over the plurality of first layers, the plurality of gate electrodes, and the substrate to form a second initial gate-line slit that exposes the substrate.

In some embodiments, removing the portion of the channel-forming structure to divide the memory layer into a plurality of sub-memory portions includes the following operations. First, the plurality of first layers and a portion of the blocking layer can be removed to expose the memory layer and form a third initial gate-line slit. A portion of the memory layer can be removed to expose the tunneling layer. A portion of the tunneling layer can then be removed to form a plurality of recessed areas in the tunneling layer to form a gate-line slit, the plurality of recessed areas dividing the memory layer into the plurality of sub-memory layers.

In some embodiments, removing the portion of the memory layer includes removing the portion of the memory layer that is along a non-vertical direction and retaining another portion of the memory layer that is along the vertical direction.

In some embodiments, removing the portion of the tunneling layer includes performing a recess etching process on the tunneling layer to remove the portion of the tunneling layer at a terminal of the one or more sub-memory layers.

In some embodiments, removing the portion of the blocking layer to expose the memory layer includes performing an etching process that selectively etches the blocking layer to expose the memory layer.

In some embodiments, the method further includes forming a sealing structure that insulates the plurality of gate electrodes from one another.

In some embodiments, forming the sealing structure includes forming an initial sealing structure that covers the exposed blocking layer, the exposed memory layer, the exposed tunneling layer, the plurality of recessed areas, and the plurality of gate electrodes, and fills the gate-line slit. Forming the sealing structure can also include patterning the initial sealing structure to form a source trench that exposes the substrate to form the sealing structure.

In some embodiments, forming the initial sealing structure includes performing a chemical vapor deposition process and the initial sealing structure includes silicon oxide.

In some embodiments, the method further includes performing an ion implantation process in the source trench to form a doped region in the substrate, and filling the source trench with a conductor material.

In some embodiments, the conductor material includes one or more of tungsten, doped poly-silicon, copper, aluminum, cobalt, doped silicon, and silicides.

In some embodiments, the method for forming a 3D memory device includes the following operations. First, a staircase structure of a plurality first layers and a plurality of second layers can be formed. The staircase structure can be alternatingly arranged over a substrate. A semiconductor channel can be formed in the staircase structure, the semiconductor channel extending from a top surface of the staircase structure to the substrate. The plurality of second layers can be replaced with a plurality of gate electrodes. The plurality of first layers can be removed and a sealing structure can be formed to insulate the plurality of gate electrodes from one another. A source structure can then be formed in the sealing structure. The source structure can extend from the top surface of the staircase structure to the substrate.

In some embodiments, forming the sealing structure includes performing a chemical vapor deposition process to deposit a dielectric material that covers the plurality of gate electrodes.

In some embodiments, forming the staircase structure includes alternatingly depositing a plurality of first material layers and a plurality of second material layers over the substrate to form a stack structure over the substrate, and repetitively etching the plurality of first material layers and the plurality of second material layers along a direction perpendicular to a top surface of the substrate to respectively form the plurality of first layers and the plurality of second layers.

In some embodiments, forming the semiconductor channel in the staircase structure includes patterning the staircase structure to form a channel hole that extends from the top surface of the staircase structure to the substrate, and filling the channel hole with a blocking layer, a memory layer over the blocking layer, a tunneling layer over the memory layer, a semiconductor layer over the memory layer, and a dielectric core.

In some embodiments, replacing the plurality of second layers with a plurality of gate electrodes includes the following operations. First, the plurality of second layers can be removed to form a plurality of gate-forming tunnels. An insulating spacer layer can be formed over a sidewall of the plurality of gate-forming tunnels. A conductor layer can be deposited over the insulating spacer layer to fill up the plurality of gate-forming tunnels.

In some embodiments, forming the source structure in the sealing structure includes the following operations. First, a source trench can be formed in the sealing structure, the source trench extending from the top surface of the staircase structure to the substrate. An ion implantation process can be performed to form a doped region in the substrate at a bottom of the source trench. A conductor layer can be deposited to fill up the source trench.

In some embodiments, a 3D memory device includes a staircase structure of a plurality of gate electrodes insulated by a sealing structure over a substrate, a semiconductor channel extending from a top surface of the staircase structure to the substrate. The semiconductor channel can include a memory layer that has a plurality of sub-memory layers. Each one of the plurality of sub-memory layers can be disconnected from one another and partially surrounding a respective gate electrode. The 3D memory device can also include a source structure extending from the top surface of the staircase structure to the substrate and between adjacent gate electrodes along a direction parallel to the top surface the substrate.

In some embodiments, the plurality of sub-memory layers extend along a direction perpendicular to the top surface of the substrate, and each one of the plurality of sub-memory layers is disconnected from one another by a recessed area in the semiconductor channel.

In some embodiments, the sealing structure includes silicon oxide.

The foregoing description of the specific embodiments will so reveal the general nature of the present disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections may set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A method for forming a three-dimensional (3D) memory device, comprising:
    forming an initial channel hole in a structure of a plurality of first layers and a plurality of second layers alternatingly arranged over a substrate;
    forming an offset between a side surface of each one of the plurality of first layers and a side surface of each one of the plurality of second layers on a sidewall of the initial channel hole to form a channel hole;
    filling the channel hole with a channel-forming structure to form a semiconductor channel, the channel-forming structure comprising a memory layer extending along a vertical direction;
    replacing the plurality of second layers with a plurality of gate electrodes;
    removing a portion of the channel-forming structure to divide the memory layer into a plurality of sub-memory portions, each sub-memory portion partially surrounding a respective gate electrodes;
    wherein the replacing the plurality of second layers with the plurality of gate electrodes comprises:
        forming a first initial gate-line slit in the structure neighboring the semiconductor channel;
        removing the plurality of second layers to form a plurality of gate-forming tunnels;
        forming an insulating spacer layer over a sidewall of each one of the plurality of gate-forming tunnels; and
        forming a conductor layer over the insulating spacer layer to fill up the plurality of gate-forming tunnels to form the plurality of gate electrodes.

2. The method of claim 1, wherein forming the offset comprises removing a portion of the side surface of each one of the plurality of first layers on the sidewall of the initial channel hole.

3. The method of claim 2, wherein removing the portion of the side surface of each one of the plurality of first layers comprises performing a recess etching process that selectively etches the plurality of first layers to the plurality of second layers.

4. The method of claim 1, wherein filling the channel hole with the channel-forming structure comprises:
    forming a blocking layer over a sidewall of the channel hole;
    forming the memory layer over the blocking layer;
    forming a tunneling layer over the memory layer;
    forming a semiconductor layer over the tunneling layer; and
    forming a dielectric core over the semiconductor layer to fill up the channel hole.

5. The method of claim 1, further comprising:
    alternatingly depositing a plurality of first material layers and a plurality of second material layers over the substrate to form a stack structure over the substrate; and
    repetitively etching the plurality of first material layers and the plurality of second material layers along the vertical direction to respectively form the plurality of first layers and the plurality of second layers.

6. The method of claim 5, wherein alternatingly depositing the plurality of first material layers and the plurality of second material layers comprises alternatingly depositing a plurality of first sacrificial material layers and a plurality of second sacrificial material layers, the plurality of first sacrificial material layers comprising a different material than the plurality of second sacrificial material layers.

7. The method of claim 6, wherein depositing the plurality of first sacrificial material layers comprises depositing a plurality of one or more of polysilicon layers and carbon layers, and depositing the plurality of second sacrificial material layers comprises depositing a plurality of SiN layers.

8. The method of claim 1,
    wherein forming the insulating spacer layer comprises depositing a layer of high-k dielectric material.

9. The method of claim 4, further comprising removing excessive materials of the insulating spacer layer and the conductor layer over the plurality of first layers, the plurality of gate electrodes, and the substrate to form a second initial gate-line slit that exposes the substrate.

10. The method of claim 9, wherein removing the portion of the channel-forming structure to divide the memory layer into a plurality of sub-memory portions comprises:
    removing the plurality of first layers and a portion of the blocking layer to expose the memory layer and form a third initial gate-line slit;
    removing a portion of the memory layer to expose the tunneling layer; and removing a portion of the tunneling layer to form a plurality of recessed areas in the tunneling layer to form a gate-line slit, the plurality of recessed areas dividing the memory layer into the plurality of sub-memory layers.

11. The method of claim 10, wherein removing the portion of the memory layer comprises removing the portion of the memory layer that is along a non-vertical direction and retaining another portion of the memory layer that is along the vertical direction.

12. The method of claim 10, wherein removing the portion of the tunneling layer comprises performing a recess etching process on the tunneling layer to remove the portion of the tunneling layer at a terminal of the one or more sub-memory layers.

13. The method of claim 10, wherein removing the portion of the blocking layer to expose the memory layer comprises performing an etching process that selectively etches the blocking layer to expose the memory layer.

14. The method of claim 13, further comprising:
forming an initial sealing structure that covers the exposed blocking layer, the exposed memory layer, the exposed tunneling layer, the plurality of recessed areas, and the plurality of gate electrodes, and fills the gate-line slit;
patterning the initial sealing structure to form a source trench that exposes the substrate to form a sealing structure that insulates the plurality of gate electrodes from one another;
performing an ion implantation process in the source trench to form a doped region in the substrate; and
filling the source trench with one or more of tungsten, doped poly-silicon, copper, aluminum, cobalt, doped silicon, and silicides.

15. A method for forming a three-dimensional (3D) memory device, comprising:
forming a structure of a plurality of first layers and a plurality of second layers alternatingly arranged over a substrate;
forming a semiconductor channel in the structure, the semiconductor channel extending from a top surface of the structure to the substrate;
replacing the plurality of second layers with a plurality of gate electrodes,
wherein the replacing the plurality of second layers with the plurality of gate electrodes comprises:
forming a first initial gate-line slit in a structure neighboring the semiconductor channel,
removing the plurality of second layers to form a plurality of gate-forming tunnels,
forming an insulating spacer layer over a sidewall of each one of the plurality of gate-forming tunnels, and
forming a conductor layer over the insulating spacer layer to fill up the plurality of gate-forming tunnels to form the plurality of gate electrodes, wherein forming the insulating spacer layer comprises depositing a layer of dielectric material;
removing the plurality of first layers;
forming a sealing structure to insulate the plurality of gate electrodes from one another;
forming a source structure in the sealing structure, the source structure extending from the top surface of the structure to the substrate.

16. The method of claim 15, wherein forming the sealing structure comprises depositing a dielectric material that covers the plurality of gate electrodes by a chemical vapor deposition process.

17. The method of claim 16, wherein forming the structure comprises:
alternatingly depositing a plurality of first material layers and a plurality of second material layers over the substrate to form a stack structure over the substrate; and
repetitively etching the plurality of first material layers and the plurality of second material layers along a direction perpendicular to a top surface of the substrate to respectively form the plurality of first layers and the plurality of second layers.

18. The method of claim 17, wherein forming the semiconductor channel in the structure comprises:
patterning the structure to form a channel hole that extends from the top surface of the structure to the substrate; and
filling the channel hole with a blocking layer, a memory layer over the blocking layer, a tunneling layer over the memory layer, a semiconductor layer over the memory layer, and a dielectric core.

19. A three-dimensional (3D) memory device, comprising:
a structure of a plurality of gate electrodes insulated by a sealing structure over a substrate;
a semiconductor channel extending from a top surface of the structure to the substrate, wherein the semiconductor channel comprises a memory layer that comprises a plurality of sub-memory layers, each one of the plurality of sub-memory layers being disconnected from one another and partially surrounding a respective gate electrode; and
a source structure extending from the top surface of the structure to the substrate and between adjacent gate electrodes along a direction parallel to the top surface the substrate, wherein the plurality of sub-memory layers extend along a direction perpendicular to the top surface of the substrate, and each one of the plurality of sub-memory layers is disconnected from one another by a corresponding recessed area in the semiconductor channel.

20. The 3D memory device of claim 19, wherein the corresponding recessed area extends horizontally with the corresponding plurality of sub-memory layers vertically above and below the corresponding recessed area.

* * * * *